(12) United States Patent
Jung (10) Patent No.: US 8,934,067 B2
(45) Date of Patent: Jan. 13, 2015

(54) DISPLAY DEVICE HAVING BRACKET COUPLED TO CHASSIS

(75) Inventor: Yonghun Jung, Seoul (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 175 days.

(21) Appl. No.: 13/572,265

(22) Filed: Aug. 10, 2012

(65) Prior Publication Data

US 2013/0057802 A1  Mar. 7, 2013

(30) Foreign Application Priority Data

Sep. 6, 2011  (KR) .......................... 10-2011-0090352

(51) Int. Cl.
```
G02F 1/1333    (2006.01)
H04N 5/64      (2006.01)
F16M 11/00     (2006.01)
H05K 7/14      (2006.01)
H05K 7/18      (2006.01)
F16M 11/22     (2006.01)
F16M 13/02     (2006.01)
```

(52) U.S. Cl.
CPC ................ *G02F 1/1333* (2013.01); *H05K 7/14* (2013.01); *H05K 7/18* (2013.01); *F16M 11/22* (2013.01); *F16M 13/02* (2013.01); *Y10S 248/917* (2013.01)
USPC ............. 349/58; 348/836; 348/839; 348/843; 361/679.21; 248/917

(58) Field of Classification Search
CPC ......... G02F 1/1333; F16M 11/10; H04N 5/64
USPC .......... 349/58; 348/836, 839, 843; 361/679.2; 248/917
See application file for complete search history.

(56) References Cited

U.S. PATENT DOCUMENTS

2005/0236548 A1* 10/2005 Maruta .......................... 248/476
2005/0264985 A1* 12/2005 Kim et al. ...................... 361/681
2009/0135330 A1*  5/2009 Kawase et al. ................... 349/58

FOREIGN PATENT DOCUMENTS

| JP | 2005-338788 | 12/2005 |
|----|-------------|---------|
| KR | 10-2005-0112864 A | 12/2005 |
| KR | 10-2008-0019472 A2 | 3/2008 |
| KR | 10-2009-0002925 A | 1/2009 |

\* cited by examiner

*Primary Examiner* — Michael Caley
(74) *Attorney, Agent, or Firm* — F. Chau & Associates, LLC (57) ABSTRACT

Provided is a display device including a display panel displaying an image, a chassis containing the display panel and including at least one joining region, in which a main through hole and at least one sub-through hole are provided, a bracket disposed on the joining region and facing the display panel, the bracket including a first through hole corresponding to the main through hole and a second through hole corresponding to the sub-through hole, and a joining element inserted into the sub-through hole and the second through hole to couple the chassis to the bracket.

19 Claims, 7 Drawing Sheets

DISPLAY DEVICE HAVING BRACKET COUPLED TO CHASSIS

CROSS-REFERENCE TO RELATED APPLICATION

This U.S. non-provisional patent application claims priority under 35 U.S.C. §119 to Korean Patent Application No. 10-2011-0090352, filed on Sep. 6, 2011, in the Korean Intellectual Property Office, the entire contents of which are hereby incorporated by reference herein.

BACKGROUND

Embodiments of the inventive concepts relate generally to a display device, and more particularly, to a mountable display device.

There has been research to develop a wall-mountable display device having a thin profile. The display device includes a display panel and a display panel driving portion positioned in a chassis. The wall-mountable display device is mounted on a wall using a wall-mounting structure fixed on the wall.

Known mounting structures for display devices have resulted in a weak joint between the wall-mounting structure and the chassis, leading to a detachment of the display device from the wall-mounting structure and breakage of the display device.

Some suggested joint structures to strengthen the joint between the wall-mounting structure and the chassis are complex and may increase a cost of the display device.

SUMMARY

Embodiments of the inventive concept provide a display device configured to result in a strong joint between a chassis and a wall-mounting structure, while also reducing a fabrication cost.

According to an example embodiment of the inventive concept, a display device includes a display panel displaying an image, a chassis containing the display panel and including at least one joining region, in which a main through hole and at least one sub-through hole are provided. In addition, the display device includes a bracket disposed on the joining region and facing the display panel, the bracket including a first through hole corresponding to the main through hole and a second through hole corresponding to the sub-through hole, and a joining element inserted into the sub-through hole and the second through hole to couple the chassis to the bracket.

In some embodiments, the joining element includes first threads, and an inner wall of the second through hole includes second threads that mate with the first threads.

In some embodiments, the bracket further includes a first protruding portion protruding from the bracket toward the display panel and having a first joining hole extending from the second through hole. The second threads extend along an inner wall of the first joining hole.

In some embodiments, an inner wall of the main through hole includes third threads. The bracket further includes a second protruding portion protruding from the bracket toward the display panel. The second protruding portion includes a joining concavity or a second joining hole extending from the first through hole. The third threads extend along an inner wall of the joining concavity or an inner wall of the second joining hole.

In some embodiments, a fixing element is inserted into the main through hole and the first through hole. The fixing element includes fourth threads that mate with the third threads. The fixing element is a part of a display device fixing bracket provided on a wall.

A chassis for a display device, according to an embodiment of the inventive concept, comprises a joining region formed on a surface of the chassis, the joining region including a main through hole formed through the surface of the chassis and at least two sub-through holes formed through the surface of the chassis on opposite sides of the main through hole, a bracket disposed on the joining region in an interior portion of the chassis and including a first through hole corresponding to the main through hole, and at least two second through holes respectively corresponding to the at least two sub-through holes, and a plurality of joining elements respectively inserted into the two sub-through holes and the two second through holes to couple the bracket to the chassis.

A diameter of the main through hole may be larger than diameters of the two sub-through holes.

The two second through holes may each include a protruding portion protruding from a surface of the bracket and extending from the two second through holes toward an interior of the display device.

The first through hole may include a protruding portion protruding from a surface of the bracket and extending from the first through hole toward an interior of the display device.

BRIEF DESCRIPTION OF THE DRAWINGS

Example embodiments can be more clearly understood from the following brief description taken in conjunction with the accompanying drawings. FIGS. 1 through 9 represent non-limiting, example embodiments as described herein.

DETAILED DESCRIPTION

Example embodiments of the inventive concept will now be described more fully with reference to the accompanying drawings, in which example embodiments are shown.

Figure 1:
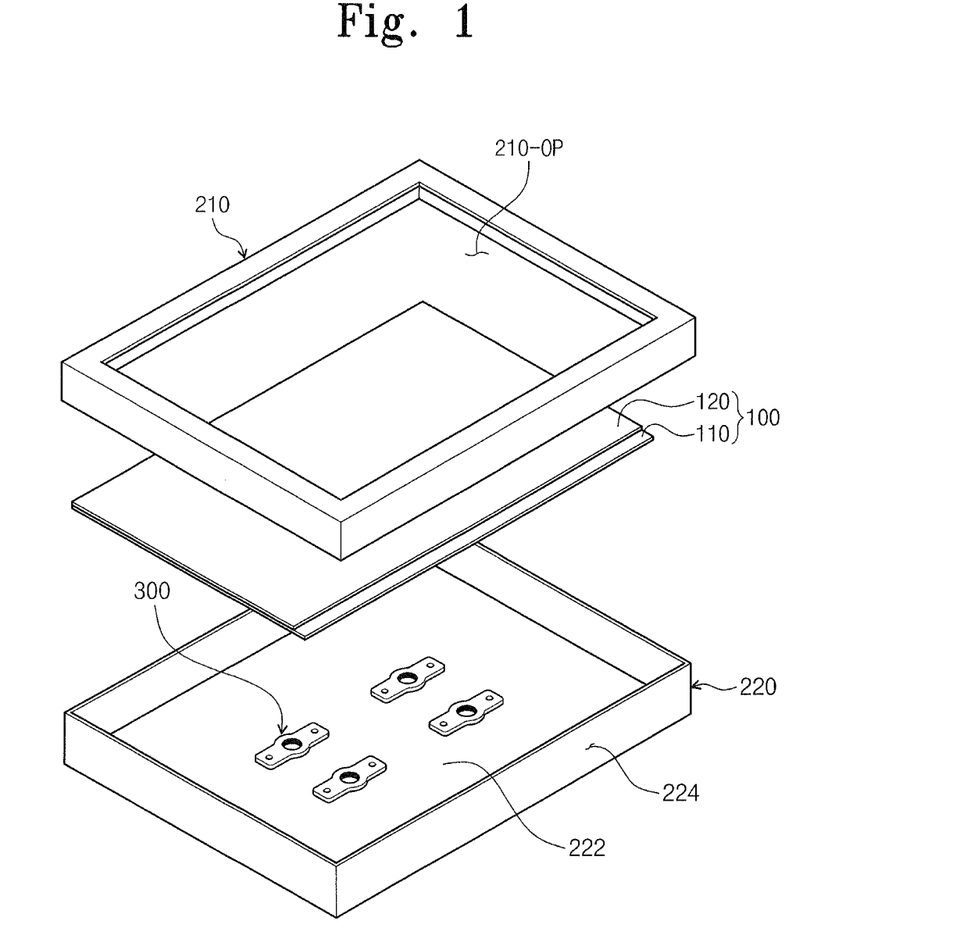
FIG. 1 is an exploded perspective view of a display device according to an example embodiment of the inventive concept.
Figure 2:
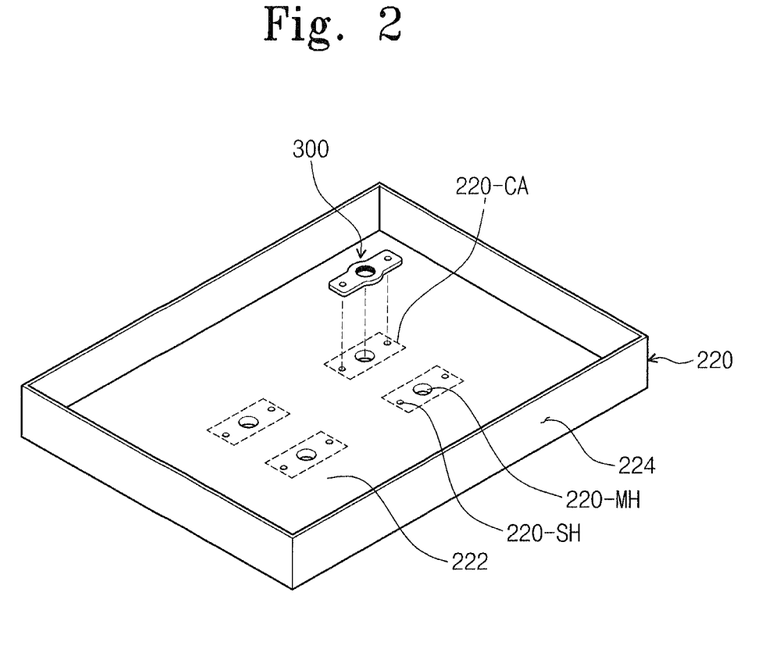
FIG. 2 is an exploded perspective view illustrating a bracket and a bottom chassis of the display device of FIG. 1.
Figure 3:
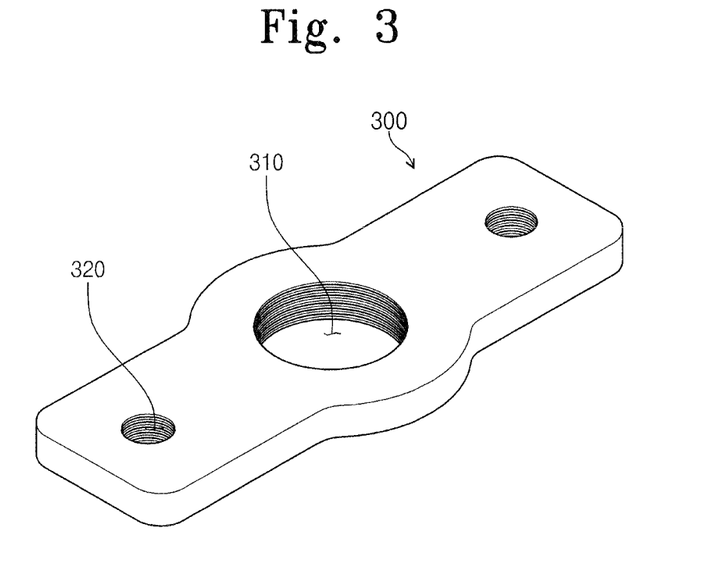
FIG. 3 is a perspective view illustrating the bracket of the display device of FIG. 1.
Figure 4:
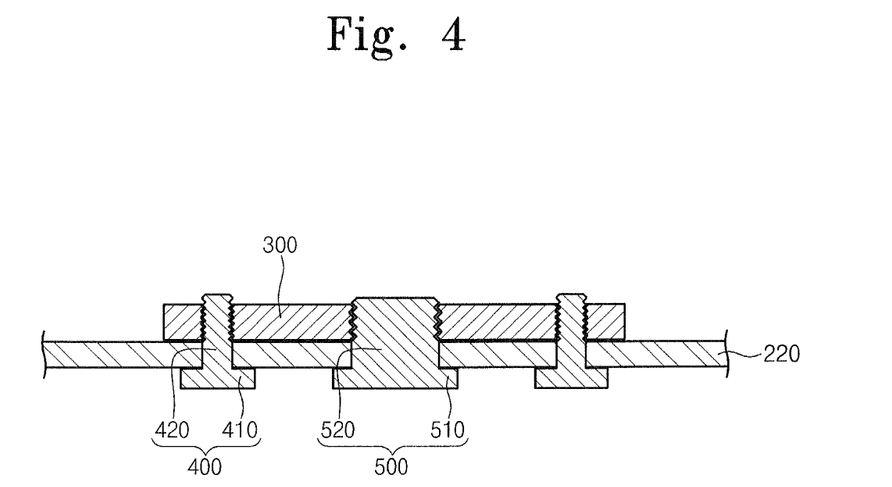
FIG. 4 is a sectional view illustrating a joining structure between the bracket and the bottom chassis of the display device of FIG. 1.
Figure 5:
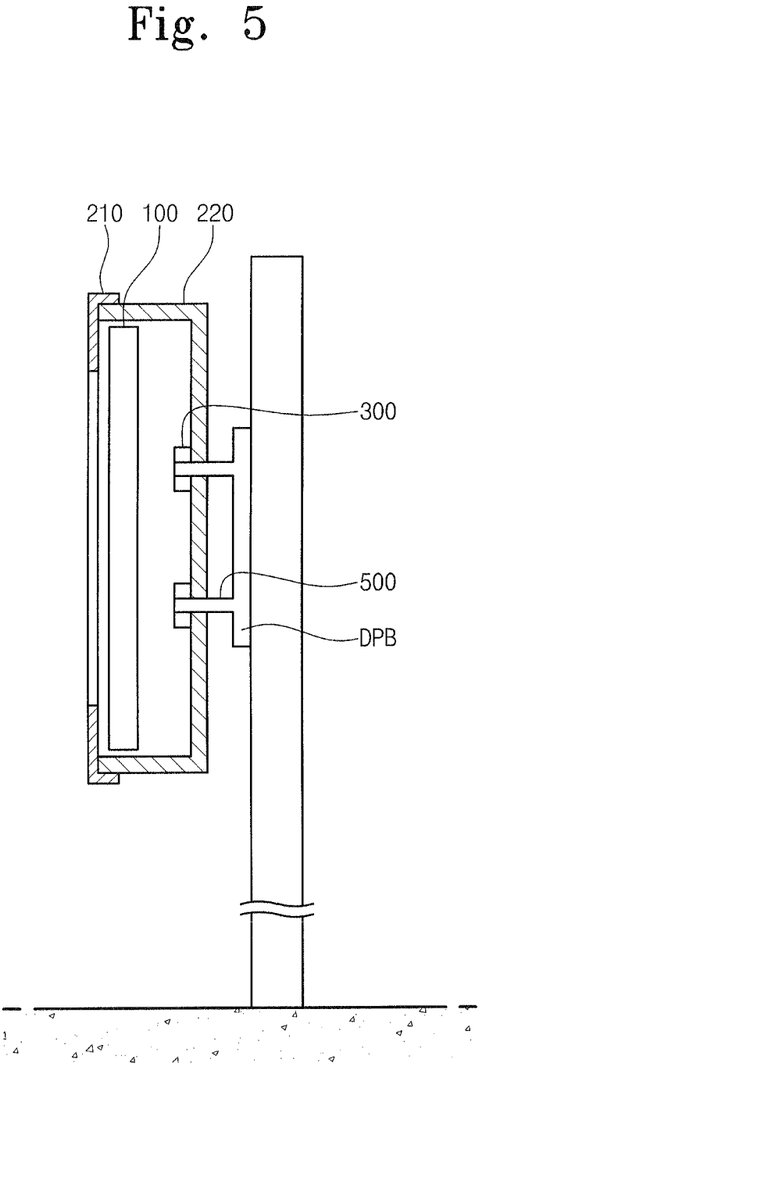
FIG. 5 is a sectional view illustrating the display device of FIG. 1 mounted on a wall, according to an embodiment of the inventive concept.

FIG. 1 is an exploded perspective view of a display device according to an example embodiment of the inventive concepts, and FIG. 2 is an exploded perspective view illustrating a bracket and a bottom chassis of the display device of FIG. 1. FIG. 3 is a perspective view illustrating the bracket, and FIG. 4 is a sectional view illustrating a joining structure between the bracket and the bottom chassis of the display device of FIG. 1. FIG. 5 is a sectional view illustrating the display device of FIG. 1 mounted on a wall, according to an embodiment of the inventive concept.

The display device includes a display panel 100 configured to display an image. Example embodiments of the inventive concept are not limited to a specific type of the display panel. For example, the display panel 100 may be a liquid crystal display panel, an organic light emitting display panel, a plasma display panel, an electrophoretic display panel, an electrowetting display panel, and so forth.

In the case in which the display panel 100 is a liquid crystal display panel, the display panel 100 includes a first substrate 110, a second substrate 120 facing the first substrate, and a liquid crystal layer (not shown) interposed between the first substrate 110 and the second substrate 120. According to an embodiment, the display device further includes a backlight unit (not shown) supplying light to the display panel 100.

According to an embodiment, the first substrate 110 includes a plurality of gate lines, a plurality of data lines, and a plurality of pixels. The data lines are disposed to cross the gate lines and are electrically insulated from the gate lines. Each of the pixels includes a thin film transistor, which is electrically connected to a corresponding one of the gate lines and a corresponding one of the data lines. In addition, each of the pixels includes a pixel electrode connected to the thin film transistor.

A common electrode is disposed on a surface of the second substrate 120 facing the first substrate 110. According to an embodiment, a color filter is provided on the second substrate 120 to result in various colors for images on the display panel (e.g., red, green and blue). It should be noted that example embodiments are not limited thereto. For example, in some embodiments, the common electrode and the color filter are provided on, for example, the first substrate 110, not the second substrate 120.

The display device includes a chassis containing the display panel 100. For example, as shown in FIG. 1, the chassis includes a top chassis 210 and a bottom chassis 220, but example embodiments are limited thereto. For example, the chassis may be provided as a single-body chassis or configured to include three or more parts. The following description refers to an embodiment in which the chassis includes the top chassis 210 and the bottom chassis 220.

The display panel 100 is positioned between the top chassis 210 and the bottom chassis 220. The top chassis 210 includes an opening 210-OP corresponding to an image displaying region of the display panel 100. The bottom chassis 220 is configured to contain or substantially contain the display panel 100 and to be coupled with the top chassis 210.

According to an embodiment, the top chassis 210 is configured to press the display panel 100 in the bottom chassis 220, thereby preventing the display panel 100 from being detached from the bottom chassis 220. The bottom chassis 220 includes a bottom portion 222 and a sidewall portion 224 extending upward from the bottom portion 222.

The bottom chassis 220 includes at least one joining region 220-CA. For example, according to an embodiment, the bottom chassis 220 includes four joining regions 220-CA, as exemplarily shown in FIGS. 1 and 2. In some embodiments, the joining regions 220-CA have the substantially same structure and function. In this sense, for the sake of simplicity, one of the joining regions 220-CA is described.

The joining region 220-CA includes a main through hole 220-MH and at least one sub-through hole 220-SH. For example, according to an embodiment, two sub-through holes 220-SH are provided in each of the joining regions 220-CA, as exemplarily shown in FIGS. 1 and 2.

The main through hole 220-MH is configured to receive a fixing element inserted therein, the fixing element substantially fixing the display device to a wall. The sub-through hole 220-SH is configured to receive a joining element inserted therein, the joining element joining a bracket 300 with the bottom chassis 220. A weight of the display device is substantially supported by the fixing element, and therefore, the fixing element has a diameter greater than that of the joining element. For this reason, the main through hole 220-MH has a diameter greater than that of the sub-through hole 220-SH.

The display device further includes brackets 300 disposed to face the display panel 100. As shown in FIGS. 1 and 2, each of the brackets 300 is disposed at a corresponding one of the joining regions 220-CA. In some embodiments, the brackets 300 are configured to have the substantially same structure and function as each other, and for the sake of simplicity, one of the brackets 300 is described.

The bracket 300 is described in more detail with reference to FIG. 3. The bracket 300 includes a first through hole 310 corresponding to the main through hole 220-MH and at least one second through hole 320 corresponding to the sub-through hole 220-SH. In some embodiments, the number of the second through holes 320 is the same as that of the sub-through holes 220-SH.

The bracket 300 is shaped like a plate with a predetermined thickness, as shown in FIG. 3, and is formed of, for example, metal or plastic.

The bracket 300 is disposed on the joining region 220-CA of the bottom chassis 220. The first through hole 310 is disposed to correspond to the main through hole 220-MH and the second through holes 320 are disposed to correspond to the sub-through holes 220-SH.

The bracket 300 is fixed to the bottom chassis 220 by joining elements 400. A joining structure between the bracket 300 and the bottom chassis 220 is described in more detail with reference to FIG. 4.

Each of the joining elements 400 are inserted into respective sub-through holes 220-SH and respective second through holes 320, which are disposed to correspond to each other. Each of pairs of the sub-through holes 220-SH and the second through holes 320 are fastened by a corresponding one of joining elements 400.

According to an embodiment, the joining element 400 is a bolt. For example, the joining element 400 includes a head portion 410 and a body portion 420. The head portion 410 has a diameter greater than that of the sub-through hole 220-SH. The body portion 420 extends from the head portion 410 and includes threads (hereinafter, first threads) formed on an outer side surface thereof.

The joining element 400 is coupled with the bracket 300 by screwing the joining element 400 into the holes 320. The second through holes 320 include corresponding threads (hereinafter, second threads) formed on an inner side surface thereof, which couple with the first threads.

In the case in which the body portion 420 of the joining element 400 protrudes from the second through hole 320 or a length of the body portion 420 is greater than a sum of lengths of the second through hole 320 and the sub-through hole 220-SH, a nut may be screwed on an end portion of the body portion 420. According to an embodiment, if there is the nut coupled with the body portion 420, the second threads in the second through hole 320 may be omitted.

According to an embodiment, the display device is fixed on a wall by utilizing a structure including fixing elements 500.

As shown in FIG. 5, the fixing element 500 is a part of a display device fixing bracket DPB provided on a wall.

The fixing element 500 is inserted into the main through hole 220-MH and the first through hole 310 and is connected to the bracket 300 by screwing the fixing bracket in the first through hole 310. The first through hole 310 includes threads (hereinafter, third threads) formed on an inner side surface thereof. The fixing element 500 includes threads (hereinafter, fourth threads) formed on an outer side surface thereof and coupled with the third threads. According to an embodiment, the fixing element 500 is a bolt having a head portion 510 and a body portion 520.

As afore-described, the bracket 300 is coupled with the bottom chassis 220 of the display device using the joining elements 400, and the display device is coupled with the display device fixing bracket DPB using the fixing elements 500.

Figure 6:
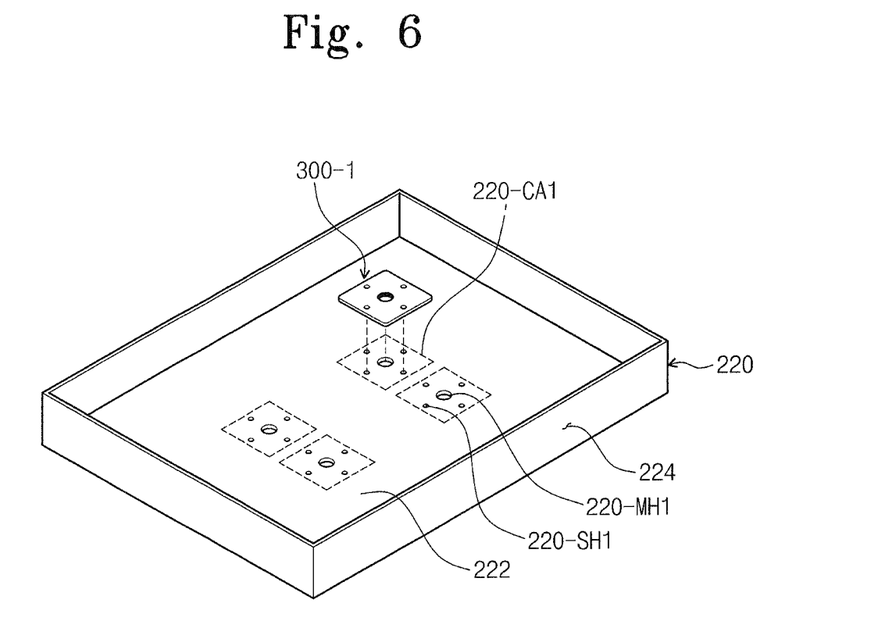
FIG. 6 is an exploded perspective view illustrating a bracket and a bottom chassis according to an embodiment of the inventive concept.

FIG. 6 is an exploded perspective view illustrating a bracket and a bottom chassis according an example embodiment of the inventive concept.

The bottom chassis 220 includes at least one joining region 220-CA1. For example, the bottom chassis 220 includes four joining regions 220-CA1, as exemplarily shown in FIG. 6. In some embodiments, the joining regions 220-CA1 have the substantially same structure and function. Accordingly, for the sake of simplicity, one of the joining regions 220-CA1 are described.

In the joining region 220-CA1, there is a main through hole 220-MH1 and four sub-through holes 220-SH1. The main through hole 220-MH1 is surrounded by the four sub-through holes 220-SH1. In some embodiments, the four sub-through holes 220-SH1 are arranged, with equal spacing, around the main through hole 220-MH1.

According to the present embodiment, a bracket 300-1 includes four second through holes 320-1 corresponding to the four sub-through holes 220-SH1. In some embodiments, the bracket 300-1 has a square shape, as shown in FIG. 6, but a shape of the bracket 300-1 is not limited thereto. For example, the bracket 300-1 may be shaped like a cross having a central portion, in which a first through hole 310-1 is provided, and four extensions, in which the second through holes 320-1 are provided, respectively.

Joining elements 400 are inserted into the sub-through holes 220-SH1 and the second through holes 320-1. According to the present embodiment, since the numbers of the sub-through holes 220-SH1 and the second through holes 320-1 is increased, a relatively strong joining structure between the bottom chassis 220 and the bracket 300-1 is achieved.

Figure 7:
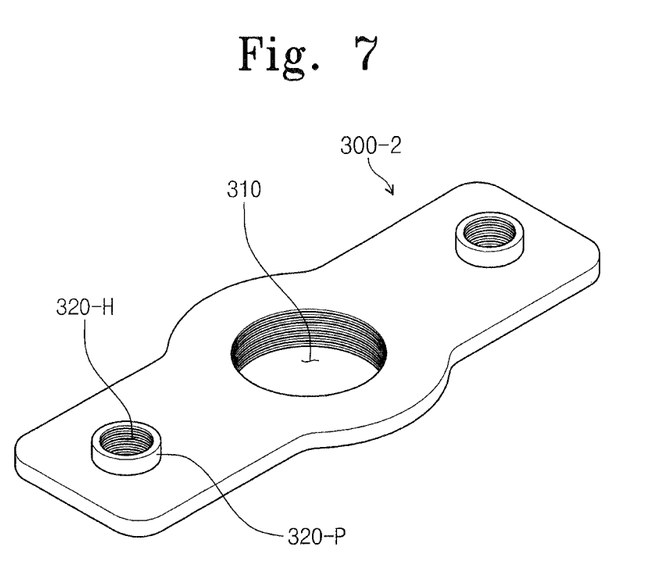
FIG. 7 is a perspective view of a bracket according to an example embodiment of the inventive concept.
Figure 8:
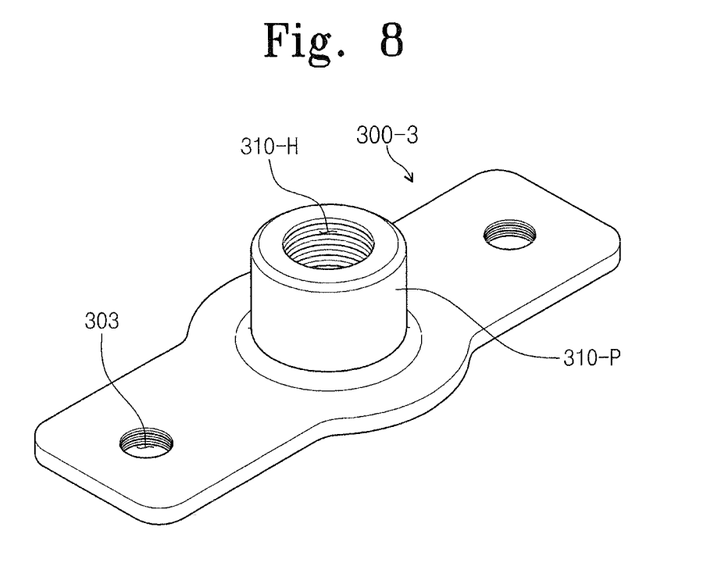
FIG. 8 is a perspective view of a bracket according to an example embodiment of the inventive concept.
Figure 9:
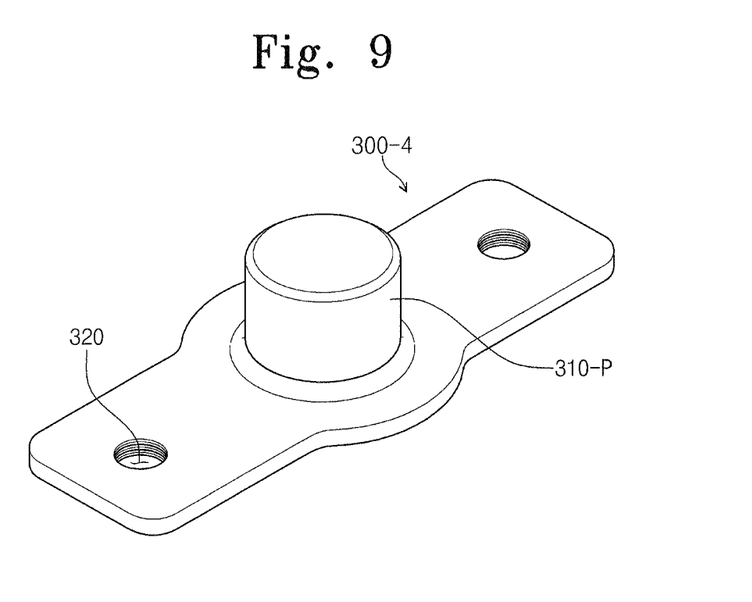
FIG. 9 is a perspective view of a bracket according an example embodiment of the inventive concept.

FIGS. 7 through 9 are perspective views of brackets according to example embodiments of the inventive concept.

Referring to FIG. 7, a bracket 300-2 further include a first protruding portion 320-P extending from the second through hole 320. The first protruding portion 320-P defines a first joining hole 320-H therein. In some embodiments, the first protruding portion 320-P protrudes from the bracket 300-2 toward the display panel 100, when the bracket 300-2 is disposed on the joining region 220-CA.

The second threads, which are formed on the inner wall of the second through hole 320, also extend along an inner wall of the first joining hole 320-H. As a result, at least a portion of the joining element 400 (shown in FIG. 4) is inserted into the first joining hole 320-H.

The presence of the first joining hole 320-H increases a joining area between the joining element 400 and the bracket 300. As a result, even in the case in which the plate-shaped portion of the bracket 300-2 is thin, the bracket 300-2 can be securely coupled with the bottom chassis 220.

Referring to FIGS. 8 and 9, brackets 300-3 or 300-4 further include a second protruding portion 310-P. The second protruding portion 310-P protrudes from the bracket 300-3 or 300-4 toward the display panel 100, when the bracket 300-3 or 300-4 is disposed on the joining region 220-CA.

For the bracket 300-3 of FIG. 8, the second protruding portion 310-P includes a second joining hole 310-H extending from the first through hole 310. The third threads, which are formed on the inner wall of the first through hole 310, extend along an inner wall of the second joining hole 310-H.

In this case, at least a portion of the fixing element 500 is inserted into the second joining hole 310-H through the main through hole 220-MH and the first through hole 310. The presence of the second joining hole 310-H increases a joining area between the fixing element 500 and the bracket 300. As a result, even in the case in which the bracket 300-3 is thin, the bottom chassis 220 can be securely coupled with the display device fixing bracket DPB of FIG. 5.

For the bracket 300-4 of FIG. 9, the second protruding portion 310-P includes a joining concavity extending from the first through hole 310. The third threads, which are formed on the inner wall of the first through hole 310, also extend along an inner wall of the joining concavity. The joining concavity of the bracket 300-4 is the same as the second joining hole 310-H of the bracket 300-3 of FIG. 8, in terms of function, but differs from the second joining hole 310-H in that the joining concavity of the bracket 300-4 has one open side and one closed side. As a result, the fixing element 500 is inserted into the first through hole 310 and the second protruding portion 310-P, but does not protruded from the protruding portion 310-P of the bracket 300-4.

According to example embodiments of the inventive concept, the display device includes brackets configured to achieve a strong and secure joint between a chassis and fixing elements.

The display device includes the bracket having a relatively simple structure to reduce fabrication costs and to simplify an internal structure of a display device.

While example embodiments of the inventive concepts have been particularly shown and described, it will be understood by one of ordinary skill in the art that variations in form and detail may be made therein without departing from the spirit and scope of the inventive concepts.

What is claimed is:
1. A display device, comprising:
   a display panel;
   a chassis containing the display panel, the chassis comprising a bottom portion including plurality of through holes and a sidewall portion extending upward from the bottom portion, the chassis including at least one joining region at the bottom portion, wherein the plurality of through holes comprises a main through hole and at least one sub-through hole disposed at the joining region;
   a bracket comprising a plurality of through holes, the bracket disposed on the joining region and disposed between the display panel and the chassis, the through holes of the bracket including a first through hole overlapping the main through hole and a second through hole overlapping the sub-through hole, wherein the bracket comprises a protruding portion protruding from at least one of the through holes of the bracket toward the display panel;
   a joining element inserted into the sub-through hole and the second through hole to couple the bracket to the chassis, wherein the joining element is apart from an external structure; and a fixing element inserted into the main through hole to fix the chassis onto the external structure.

2. The display device of claim 1, wherein the joining element includes first threads.

3. The display device of claim 2, wherein an inner wall of the second through hole includes second threads that mate with the first threads.

4. The display device of claim 1, wherein the protruding portion further comprises a joining hole extending from the second through hole.

5. The display device of claim 4, wherein the second threads extend along an inner wall of the joining hole.

6. The display device of claim 5, wherein at least a portion of the joining element is inserted into the joining hole.

7. The display device of claim 1, wherein an inner wall of the main through hole includes threads.

8. The display device of claim 7, wherein the bracket further comprises a protruding portion protruding from the bracket toward the display panel, the protruding portion having a joining concavity or a joining hole formed extending from the first through hole.

9. The display device of claim 8, wherein the threads extend along an inner wall of the joining concavity or an inner wall of the joining hole.

10. The display device of claim 1, wherein the fixing element comprises threads that mate with the threads of the main through hole.

11. The display device of claim 10, wherein the fixing element is a part of a display device fixing bracket provided on the external structure.

12. The display device of claim 1, wherein the main through hole has a diameter greater than a diameter of the sub-through hole.

13. The display device of claim 12, comprising two sub-through holes in each joining region, wherein one of the two sub-through holes is disposed across from the other of the two sub-through holes with respect to the main through hole positioned between the two sub-through holes.

14. The display device of claim 12, comprising four sub-through holes in each joining region, wherein the four sub-through holes are arranged, with an equal spacing, around the main through hole.

15. The display device of claim 1, wherein the display panel is a liquid crystal display panel comprising two substrates facing each other and a liquid crystal layer between the two substrates.

16. The display device of claim 15, wherein the chassis comprises:
a bottom chassis including the joining region therein; and
a top chassis coupled with the bottom chassis.

17. A container unit containing a display panel, the container unit comprising:
a chassis comprising;
a bottom portion on which a joining region is provided and comprising a plurality of through holes at the joining region, the plurality of through holes including a main through hole formed through the surface of the bottom portion and at least two sub-through holes formed through the surface of the bottom portion and opposite to each other across the main through hole; and
a sidewall portion extending upward from the bottom portion to contain the display panel;
a bracket comprising a plurality of through holes disposed on the joining region between the chassis and the display panel, wherein the plurality of through holes comprises a first through hole overlapping the main through hole, and at least two second through holes respectively overlapping the at least two sub-through holes, wherein the bracket comprises a protruding portion protruding from the bracket toward an interior of the display device;
a plurality of joining elements respectively inserted into the two sub-through holes and the two second through holes to couple the bracket to the chassis; and
a fixing element inserted into the main though hole to fix the chassis onto an external structure, wherein the fixing element connects the chassis to the external structure at an outside of the chassis.

18. The container unit of claim 17, wherein a diameter of the main through hole is larger than diameters of the two sub-through holes.

19. The container unit of claim 17, wherein the two second through holes each include a second protruding portion protruding from a surface of the bracket and extending from the two second through holes toward an interior of the display device.

* * * * *